(12) United States Patent
Cameron

(10) Patent No.: US 6,458,506 B2
(45) Date of Patent: Oct. 1, 2002

(54) PHOTOACID GENERATORS AND PHOTORESISTS COMPRISING SAME

(75) Inventor: James F. Cameron, Cambridge, MA (US)

(73) Assignee: Shipley Company, LLC, Marlborough, MA (US)

( * ) Notice: Subject to any disclaimer, the term of this patent is extended or adjusted under 35 U.S.C. 154(b) by 0 days.

(21) Appl. No.: 09/373,802

(22) Filed: Aug. 13, 1999

Related U.S. Application Data

(60) Provisional application No. 60/096,648, filed on Aug. 14, 1998.

(51) Int. Cl.$^7$ .............................................. G03C 1/492
(52) U.S. Cl. ...................... 430/270.1; 430/921; 568/18; 568/23; 568/28; 568/30
(58) Field of Search .............................. 430/270.1, 920, 430/921; 568/23, 18, 28, 30

(56) References Cited

U.S. PATENT DOCUMENTS

| | | | | |
|---|---|---|---|---|
| 5,237,059 A | * | 8/1993 | Wakamatsu et al. | 540/355 |
| 5,279,923 A | * | 1/1994 | Hiro et al. | 430/270 |
| 5,707,776 A | | 1/1998 | Kawabe et al. | 430/270.1 |
| 5,837,420 A | * | 11/1998 | Aoai et al. | 430/270.1 |
| 5,885,745 A | * | 3/1999 | Marrocco, III | 430/270.1 |
| 5,965,319 A | * | 10/1999 | Kobayashi | 430/176 |
| 6,048,666 A | * | 4/2000 | Niwa et al. | 430/280.1 |
| 6,245,930 B1 | * | 6/2001 | Oomori et al. | 558/301 |

FOREIGN PATENT DOCUMENTS

| | | |
|---|---|---|
| EP | 0 523 957 | 1/1993 |
| EP | 0 794 457 | 9/1997 |
| JP | 1018143 A2 | 1/1989 |
| JP | 5-152718 A2 | 6/1993 |
| JP | 5-307262 A2 | 11/1993 |
| JP | 6110209 A2 | 4/1994 |
| JP | 09309874 A2 | 12/1997 |
| JP | 11007124 A2 | 1/1999 |
| JP | 11084654 A2 | 3/1999 |

OTHER PUBLICATIONS

JP 09–309874, Feb. 1997, machine translation of detailed description, examples, claim.*

* cited by examiner

*Primary Examiner*—Rosemary Ashton
(74) *Attorney, Agent, or Firm*—Peter F. Corless; Christine C. O'Day

(57) ABSTRACT

This invention relates to new photoacid generator compounds and photoresist compositions that comprise such compounds. In particular, the invention relates to photoacid generator compounds that generate an anthracene acid upon exposure to activating radiation, particularly anthracene sulfonic acids such as acids that include 9,10-dialkoxyanthracene-2-sulfonate moieties. Positive- and negative-acting chemically amplified resists that contain such PAGs and that are imaged with I-line (365 nm) radiation are particularly preferred.

19 Claims, No Drawings

PHOTOACID GENERATORS AND PHOTORESISTS COMPRISING SAME

The present application claims the benefit of U.S. provisional application number 60/096,648, filed Aug. 14, 1998, which is incorporated herein by reference.

BACKGROUND OF THE INVENTION

1. Field of the Invention

This invention relates to new photoacid generator compounds ("PAGs") and photoresist compositions that comprise such compounds. In particular, the invention relates to photoacid generator compounds that generate an anthracene acid upon exposure to activating radiation, particularly anthracene sulfonate acids such as acids that include 9,10-dialkoxyanthracene-2-sulfonate moieties. Positive- and negative-acting chemically amplified resists that contain such PAGs and that are imaged with I-line (365 nm) radiation are particularly preferred.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

SUMMARY OF THE INVENTION

I have now discovered novel photoacid generator compounds (PAGs) for use in either positive-acting or negative-acting photoresist compositions.

In particular, the invention provides photoacid generators that can produce an optionally substituted anthracene sulfonic acid upon exposure to activating radiation, particularly an alkoxy anthracene sulfonic acid such as 9,10-dialkoxyanthracene-2-sulfonic acid; anthracene disulfonic acid such as 9,10-dialkoxyanthracene-2,6-disulfonic acid and 9,10-dialkoxyanthracene-2,5-disulfonic acid; and anthracene acids that have both sulfonic acid and alkanoyl (e.g.—COOR where R is optionally substituted $C_{1-12}$ alkyl, preferably $C_{1-6}$ alkyl) moieties such as 9,10-dialkoxyanthracene-2-sulfonic acid-7-methylester and the like.

Preferably, PAGs of the invention are used in positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. A preferred imaging wavelength is I-line (365 nm), although other exposure wavelengths also can be utilized, including shorter wavelengths such as sub-300 nm wavelengths e.g. 248 nm. Longer wavelengths such as G-line (435 nm) also can be employed, particularly where a sensitizer is employed as an additional resist component.

The invention also provide methods for forming relief images of the photoresists of the invention, including methods for forming highly resolved patterned photoresist images (e.g. a patterned line having essentially vertical sidewalls) of sub-micron and even sub-half or sub-quarter micron dimensions.

The invention further provides articles of manufacture comprising substrates such as a microelectronic wafer or a flat panel display substrate having coated thereon the photoresists and relief images of the invention. Other aspects of the invention are disclosed infra.

DETAILED DESCRIPTION OF THE INVENTION

In a first aspect of the invention, iodonium PAGs are provided that can generate an anthracene sulfonic acid, such as diaryliodonium salts that have a counter anion of an anthracene sulfonate. Generally preferred are optionally substituted diphenyliodoium salts that have such an anthracene sulfonate counter anion, such as PAGs of the following Formula I:

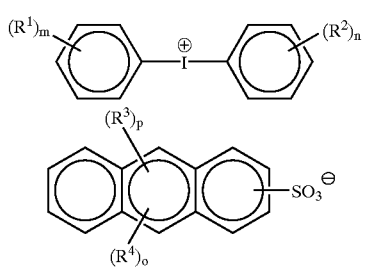

wherein $R^1$ and $R^2$ are each independently a non-hydrogen substituent such as halo; hydroxy; nitro; cyano; sulfonyl; optionally substituted alkyl preferably having from 1 to about 20 carbon atoms, more preferably 1 to about 8 carbon atoms; optionally substituted alkoxy preferably having from 1 to about 20 carbon atoms, more preferably 1 to about 8 carbon atoms; optionally substituted aminoalkyl preferably having from 1 to about 20 carbon atoms, more preferably 1 to about 8 carbon atoms; optionally substituted alkylthio preferably having from 1 to about 20 carbon atoms, more preferably 1 to about 8 carbon atoms; optionally substituted alkylsulfinyl preferably having from 1 to about 20 carbon atoms, more preferably 1 to about 8 carbon atoms; optionally substituted alkylsulfonyl preferably having from 1 to about 20 carbon atoms, more preferably 1 to about 8 carbon atoms; optionally substituted aryloxy such as phenoxy; optionally substituted aralkyl such as benzyl; optionally substituted alkanoyl preferably having from 1 to about 20 carbons atoms with acetyl being a preferred group; optionally substituted carbocyclic aryl such as phenyl, naphthyl, biphenyl, and the like; optionally substituted heteroaromatic or heteroalicyclic having 1 to 3 rings, 3 to 8 ring members in each ring and from 1 to 3 hetero atoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, pyrrolindinyl, etc.; and the like;

$R^3$ and $R^4$ are the same or different and are selected from the same group as defined for $R^1$ and $R^2$ above, and preferably $R^3$ and $R^4$ are alkoxy such as preferably $C_{1-12}$ alkoxy, more preferably $C_{1-6}$ alkoxy such as methoxy, ethoxy, propoxy, etc., and preferably $R^3$ and $R^4$ are substituted at the 9 and 10 position of the anthracene ring, respectively;

preferably the $SO_3^{31}$ group is substituted at the 2-position of the anthracene ring;

m and n are each independently an integer of from 0 (where the respective phenyl is fully hydrogen-substituted) to 5, and preferably m and n are each 0, 1, or 2; and o and p are each independently an integer of 0 or greater, wherein the sum of o and p is 9 or less, and preferably o and p are each 1.

Also preferred are optionally substituted dinaphthyliodonium salts that have such an anthracene sulfonate counter anion, such as PAGs of the following Formula II:

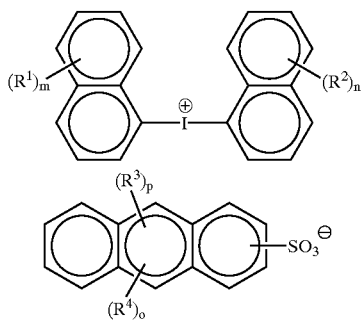

wherein $R^1$, $R^2$, $R^3$, $R^4$, o and p are each as defined above for Formula I, and preferably $R^3$ and $R^4$ are alkoxy such as $C_{1-12}$ alkoxy more preferably $C_{1-6}$ alkoxy, with the $R^3$ and $R^4$ moieties preferably substituted at the 9 and 10 position of the anthracene ring, respectively, and preferably the $SO_3^-$ group is substituted at the 2-position of the anthracene ring; and m and n are each independently an integer from 0 (where the respective phenyl is fully hydrogen-substituted) to 7, and preferably m and n are each 1, 2 or 3.

Such iodonium salts can be prepared by known procedures. See, for example, U.S. Pat. Nos. 4,442,197; 4,603,101; and 4,624,912; and European Application 0708368A1.

In another aspect of the invention, optionally substituted N-oxyimidosulfonate PAGs are provided that have an anthracene moiety. Preferred are optionally substituted N-oxyimidosulfonate PAGs that have a dialkoxy anthracene moiety, preferably a 9,10-dialkoxy anthracene substituted at the 2-position with a sulfonate group, such as PAGs of the following Formula III:

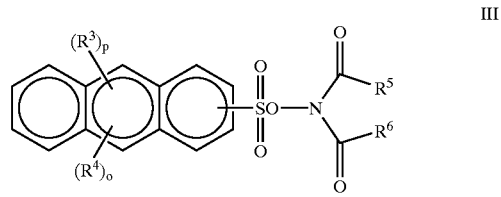

wherein $R^3$, $R^4$, o and p are the same as defined in Formula I above, and preferably $R^3$ and $R^4$ are alkoxy such as $C_{1-12}$ alkoxy, more preferably $C_{1-6}$ alkoxy, preferably substituted at the 9 and 10 position of the anthracene ring, respectively, and preferably the —$SO_3$— group is substituted at the 2-position of the anthracene ring; and $R^5$ and $R^6$ are independently optionally substituted alkyl preferably having 1 to about 10 carbon atoms; optionally substituted alkoxy preferably having 1 to about 10 carbon atoms; or optionally substituted alkylthio preferably having 1 to about 10 carbon atoms, or more preferably $R^5$ and $R^6$ are taken together to form an optionally substituted alkylene or alkenylene chain preferably having 2–5 carbons so as to ring with the N and C═O groups. Such compounds can be readily prepared from open chain and cyclic N-hydroxyimides, e.g. N-hydroxy-succinimide, N-hydroxymaleimide, N-hydroxyphthalimide, N-hydroxy-1,8-naphthalimide, N-hydroxy-5-norbornene-2,3-dicarboximide, OHN((C═O)CH$_3$)$_2$ and the like. See also International Application WO94/10608 for preparation of N-sulfonyloxyimide PAGs.

In yet a further aspect of the invention, optionally substituted N-oxyimino sulfonate PAGs are provided that have an anthracene moiety. Preferred are optionally substituted N-oxyiminosulfonate PAGs that have a dialkoxy anthracene moiety, preferably a 9,10-dialkoxy anthracene substituted at the 2-position with a sulfonate group, such as PAGs of the following Formula IV:

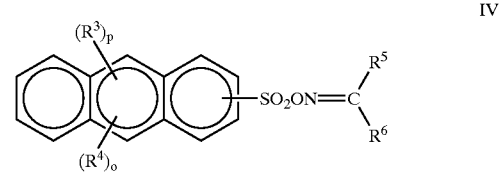

wherein $R^3$, $R^4$, o and p are the same as defined in Formula I above, and preferably $R^3$ and $R^4$ are alkoxy such as $C_{1-6}$ alkoxy, more preferably substituted at the 9 and 10 position of the anthracene ring, respectively, and preferably the —$SO_3$— group is substituted at the 2-position of the anthracene ring; and $R^5$ and $R^6$ are the same as defined in Formula III above. Such compounds can be readily prepared from oximes of open chain and cyclic ketones such as cyclohexanone, α-tetralone, pentanone, etc.

One preferred group of N-oxyiminosulfonate PAGs are α-cyano compounds, such as those of the following Formula V:

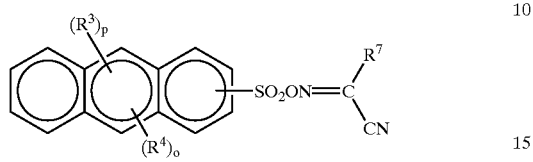

V wherein $R^3$, $R^4$, o and p are the same as defined in Formula I above, and preferably $R^3$ and $R^4$ are alkoxy such as $C_{1-6}$ alkoxy, more preferably substituted at the 9 and 10 position of the anthracene ring, respectively, and preferably the —$SO_3$— group is substituted at the 2-position of the anthracene ring; and $R^7$ is optionally substituted alkyl (including cyclic alkyl), preferably having 1 to about 10 carbon atoms; optionally substituted carbocyclic aryl such as phenyl and the like, particularly alkoxyphenyl such as methoxy. Such compounds can be prepared from open chain and cyclic acetonitrile derivatives such as 4-methoxybenzeneaectonitrile ($CH_3OC_6H_4CH_2CN$) and 1-cyclohexenylacetonitrile.

In a further aspect of the invention, optionally substituted phenolic sulfonate PAGs are provided that have one or more anthracene moieties. Such compounds have anthracenyl sulfonate groups grafted onto one or more phenolic—OH moieties, preferably two or three anthracenyl sulfonate groups on a single phenyl group. Preferred phenolic sulfonate compounds include PAGs of the following Formula VI:

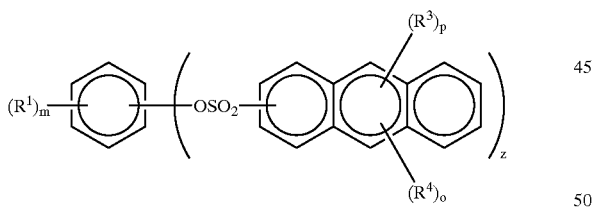

VI wherein $R^1$, $R^3$, $R^4$, p and o are the same as defined in Formula I above, and preferably $R^3$ and $R^4$ are alkoxy such as $C_{1-6}$ alkoxy, more preferably substituted at the 9 and 10 position of the anthracene ring, respectively, and preferably the —$SO_3$— group is substituted at the 2-position of the anthracene ring;

m is an integer from 0 to 4;

z is an integer from 1 to 6, and z is preferably is 1, 2, 3 or 4, and the sum of m and z does not exceed 6.

Preferred compounds of Formula VI include those where z is 3, particularly where the phenyl ring is substituted by anthracenyl sulfonate at the 1, 2, 3-positions (i.e. pyrogallol-based compounds), or 1,3,5-positions (i.e. phloroglucinol-based compounds), such as compounds of the following structures (A) and (B):

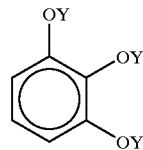
(A)

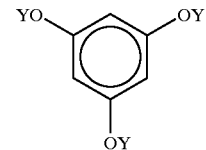
(B)

wherein each Y group of those compounds (A) and (B) is independently a group of the formula:

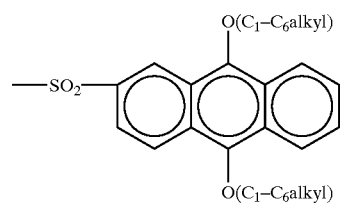

Compounds of Formula VI can be readily prepared, e.g. by reaction of a phenolic compound with an anthracenyl sulfonate reagent (e.g. anthracene sulfonyl chloride) to thereby transfer the desired anthracene moieties onto the phenolic base compound.

Optionally substituted benzylic sulfonate PAGs are provided that have one or more anthracene moieties. Such compounds have anthracenyl sulfonate groups grafted onto one or more benzylic carbons, preferably one or two anthracenyl sulfonate groups on a single phenyl base group. Preferred benzylic sulfonate compounds include PAGs of the following Formula VII:

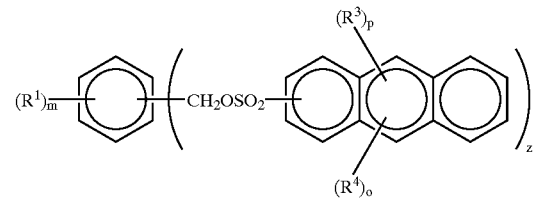

VII wherein $R^1$, $R^3$, $R^4$, p and o are the same as defined in Formula I above, and preferably $R^3$ and $R^4$ are alkoxy such as $C_{1-12}$ alkoxy, more preferably $C_{1-6}$ alkoxy, preferably substituted at the 9 and 10 position of the anthracene ring, respectively, and preferably the $SO_3^-$ group is substituted at the 2-position of the anthracene ring; and m is an integer from 0 to 4;

z is an integer from 1 to 6, and z is preferably is 1, 2 or 3, and the sum of m and z does not exceed 6.

Preferred compounds of Formula VII include those where z is 1 or 2, and the phenyl ring is substituted by one or more nitro, halo particularly fluoro, alkyl particularly $C_{1-6}$ alkyl, or alkoxy particularly $C_{1-6}$ alkoxy, such as compounds of the following structures (A) and (B):

(A)

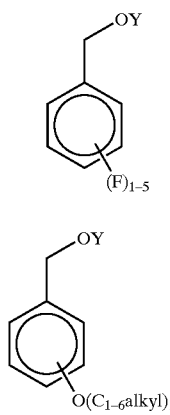

(B)

wherein each Y group of those compounds (A) and (B) is independently a group of the formula:

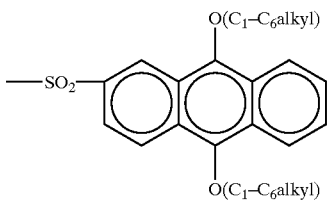

Compounds of Formula VII can be prepared, e.g., by reaction of a benzylic alcohol compound with an anthracenyl sulfonate reagent (e.g. anthracene sulfonyl chloride) to thereby transfer the desired anthracene moieties onto the benzylic base compound. See also the procedures reported in EPO Application EP 0717319A1 and U.S. Pat. No. 5,344,742 to Sinta et al.

The invention also provides anthracenyl disulfone PAGs, such as compounds of the following Formula VIII:

VIII

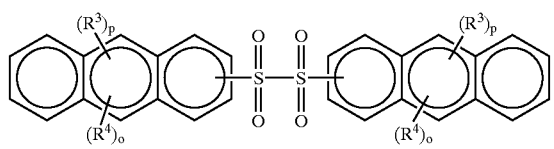

wherein each $R^3$, $R^4$, p and o are the same as defined in Formula I above, and preferably $R^3$ and $R^4$ are alkoxy such as $C_{1-12}$ alkoxy, preferably $C_{1-6}$ alkoxy, preferably substituted at the 9 and 10 position of the anthracene ring, respectively, and preferably the $SO_3^-$ group is substituted at the 2-position of the anthracene ring.

Generally preferred are 9,10-alkoxy 2-sulfonate anthracene compounds such as PAGs of the following structures:

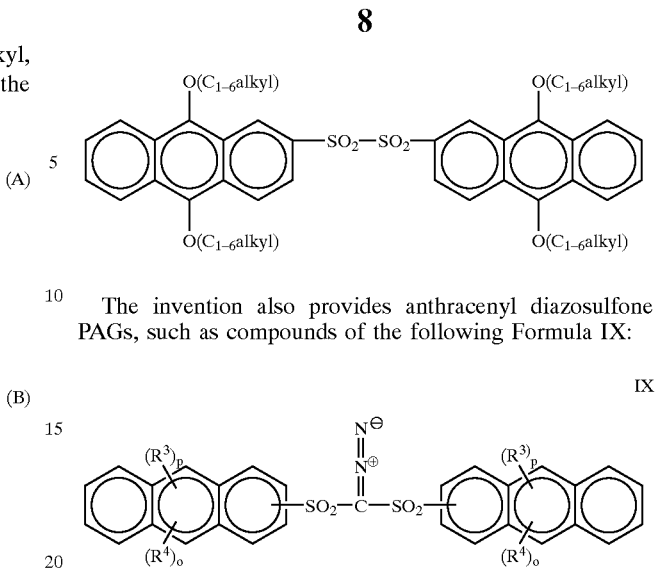

The invention also provides anthracenyl diazosulfone PAGs, such as compounds of the following Formula IX:

IX wherein each $R^3$, $R^4$, p and o are the same or different and are the same as defined in Formula I above, and preferably each $R^3$ and $R^4$ are alkoxy such as $C_{1-12}$ alkoxy, preferably $C_{1-6}$ alkoxy, preferably substituted at the 9 and 10 position of the respective anthracene ring, and preferably each $SO_3^-$ group is substituted at the 2-position of the respective anthracene ring.

Generally preferred are 9,10-alkoxy 2-sulfonate compounds such as PAGs of the following structures:

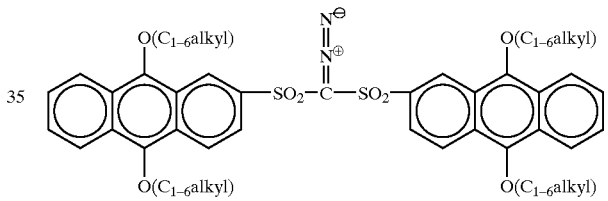

Such disulfone and diazosulfone PAGs of the invention can be synthesized by generally known procedures. See, for example, European Application 0708368A1 and U.S. Pat. No. 5,558,976.

The invention further provides PAGs that are sulfonium salts of anthracene sulfonates. Preferred compounds include triarylsulfonium salts, particularly triphenylsulfonium groups that have an optionally substituted anthracene sulfonate counter anion. Generally preferred are sulfonium salts of the following Formula X:

X

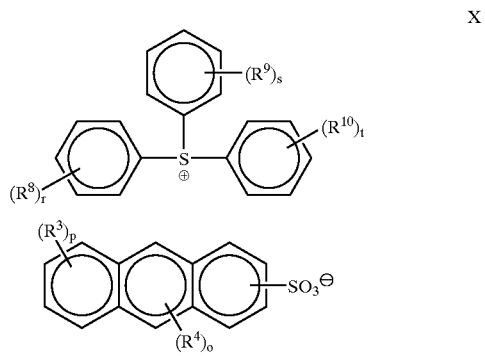

wherein $R^3$, $R^4$, p and o are the same as defined in Formula I above, and preferably $R^3$ and $R^4$ are alkoxy such as $C_{1-12}$ alkoxy, preferably $C_{1-6}$ alkoxy, preferably substituted at the 9 and 10 position of the anthracene ring, respectively, and preferably the $SO_3^-$ group is substituted at the 2-position of the anthracene ring;

$R^8$, $R^9$, $R^{10}$ are each independently selected from the same group as defined for $R^1$ and $R^2$ in Formula I above;

r, s, t are independently integers from 0 (where the phenyl ring is fully hydrogen-substituted) to 5.

Also preferred are aryl(dialkyl)sulfonium anthracene sulfonate salts, particularly phenyl(dialkyl)sulfonium, naphthyl(dialkyl)sulfonium and acenaphthyl(dialkyl)sulfonium groups that have an optionally substituted anthracene sulfonate counter anion, such as phenyl(dialkyl)sulfonium compounds of the following Formula XI:

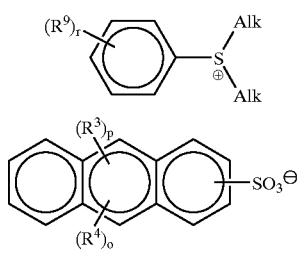

XI wherein $R^3$, $R^4$, p and o are the same as defined in Formula I above, and preferably $R^3$ and $R^4$ are alkoxy such as $C_{1-6}$ alkoxy, more preferably substituted at the 9 and 10 position of the anthracene ring, respectively, and preferably the $SO_3^-$ group is substituted at the 2-position of the anthracene ring; and $R^8$ and r are the same as defined in Formula X above;

each Alk is the same or different optionally substituted alkyl, preferably having from 1 to about 20 carbon atoms, more preferably 1 to about 12 carbon atoms, still more preferably 1 to about 6 carbon atoms, or each Alk may be taken together and form a C2–8 alkylene or alkenylene chain and thereby form a ring with the sulfur cation, preferably having from 5 to about 9 total ring members (inclusive of the sulfur), more preferably 5 to about 7 ring members.

Also preferred are naphthyl(dialkyl)sulfonium compounds of Formula XIA and acenaphthyl(dialkyl)sulfonium compounds of Formula XIB, which Formulae XIA and XIB are defined the same as Formula XI above, except that in Formula XIA the sulfonium component is $(R^8)$r-(naphthyl)-S-(Alk)$_2$ with r being an integer from 0 to 7; and that in Formula XIB the sulfonium component is $(R^8)$r-(acenaphthyl)-S-(Alk)$_2$ with r being an integer from 0 to 9.

The invention further provides PAGs that are phenacylsulfonium salts of optionally substituted anthracene sulfonates, such as compounds of the following Formula XII:

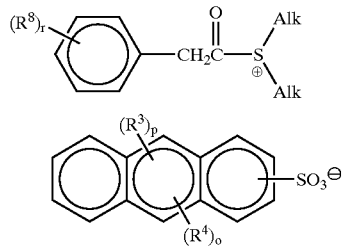

XII wherein $R^3$, $R^4$, p and o are the same as defined in Formula I above, and preferably $R^3$ and $R^4$ are alkoxy such as $C_{1-6}$ alkoxy, more preferably substituted at the 9 and 10 position of the anthracene ring, respectively, and preferably the $SO_3^-$ group is substituted at the 2-position of the anthracene ring;

$R^8$ and r are the same as defined in Formula X above;

each Alk is the same or different optionally substituted alkyl, preferably having from 1 to about 20 carbon atoms, more preferably 1 to about 12 carbon atoms, still more preferably 1 to about 6 carbon atoms, or each Alk may be taken together and form a C2–8 alkylene or alkenylene chain and thereby form a ring with the sulfur cation, preferably having from 5 to about 9 total ring members (inclusive of the sulfur), more preferably 5 to about 7 ring members.

Also preferred are naphthylacylsulfonium compounds of Formula XIIA and acenaphthyl(acyl)sulfonium compounds of Formula XIIB, which Formulae XIIA and XIB are defined the same as Formula XII above, except that in Formula XIIA the sulfonium component is $(R^8)$r-(naphthyl)CH$_2$C(=O)—S—(Alk)$_2$ with r being an integer from 0 to 7; and that in Formula XIIB the sulfonium component is $(R^8)$r—(acenaphthyl)—CH$_2$C(=O)—S—(Alk)$_2$ with r being an integer from 0 to 9.

Sulfonium salt PAGs of the invention can be prepared by known procedures, including those methods disclosed in U.S. Pat. No. 5,371,364 to Sinta et al.

Additional preferred photoacid generators of the invention include PAGs that correspond to the above Formula I, II, III, IV, V, VI, VII, VIII, IX, X, XI, XIA, XIB, XIIA and XIIB, but that generate upon exposure to activating radiation an anthracene disulfonic acid, preferably a dialkoxyanthracene disulfonic acid, preferably where the alkoxy groups are $C_{1-12}$ alkoxy or $C_{1-6}$ alkoxy, more preferably present at 9 and 10 ring positions of the anthracene ring and the disulfonic acid groups present at the 2 and 6 ring positions or the 2 and 5 anthracene ring positions. For example, preferred acids include 9,10-dialkoxyanthracene-2,6-disulfonic acid and 9,10-dialkoxyanthracene-2,5-disulfonic acid, optionally substituted such as by the same groups specified for $R^3$ and $R^4$ above, with such substituents limited of course by available valences of the anthracene acid. These preferred compounds include PAGs of Formulae I', II', III', IV', V', VI', VII', VIII', IX', X', XI', XIA', XIB', XIIA'and XIIB', which formulae are defined the same as Formulae I, II, III, IV, V, VI, VII, VIII, IX, X,XI, XIA, XIB, XIIA and XIIB respectively, except the anthracene group has an additional —SO$_3$ moiety, and the sum of p and o is 8 or less.

Still further preferred photoacid generators of the invention include PAGs that correspond to the above Formula I, II, III, IV, V, VI, VII, VIII, IX, X, XI, XIA, XIB, XIIA and XIIB, but that generate upon exposure to activating radiation an anthracene acid that has both sulfonic acid and alkanoyl (i.e. an ester ring group such as e.g. —COOR where R is optionally substituted $C_{1-12}$ alkyl such as methyl, ethyl, propyl, etc.) moieties, preferably a dialkoxyanthracne alkanyousulfonic acid, preferably where the alkoxy groups are $C_{1-12}$ alkoxy or $C_{1-6}$ alkoxy, more preferably present at 9 and 10 ring positions of the anthracene ring and the alkanoyl sulfonic acid groups present at the 2 and 6 ring positions, the 2 and 5 anthracene ring positions, or the 2 and 7 anthracene ring positions. For example, preferred such acids include 9,10-dialkoxyanthracene-2-sulfonic acid-7-methylester, optionally substituted such as by the same groups specified for $R^3$ and $R^4$ above, with such substituents limited of course by available valences of the anthracene acid. These preferred compounds include PAGs of Formulae I", II", III", IV", V", VI", VII", VIII", IX", X", XI", XIA", XIB", XIIA" and XIIB", which formulae are defined the same as Formulae I, II, III, IV, V, VI, VII, VIII, IX, X, XI, XIA, XIB, XIIA and XIIB respectively, except the anthracene group has an additional alkanoyl moiety, and the sum of p and o is 8 or less.

As mentioned above, various substituent groups of PAGs of the invention may be optionally substituted. Substituted moieties (including substituted $R^1$ through $R^{10}$ Alk, anthracene groups, etc) are suitably substituted at one or more available positions by, e.g., halogen such as F, Cl Br and/or I, alkyl including $C_{1-16}$ alkyl with $C_{1-8}$ alkyl being preferred, alkoxy including $C_{1-16}$ alkoxy having one or more oxygen linkages with $C_{1-8}$ alkoxy being preferred, alkenyl including $C_{2-12}$ alkenyl with $C_{2-8}$ alkenyl being preferred, alkenyl including $C_{2-12}$ alkenyl with $C_{2-8}$ alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl, anthracenyl and naphthyl.

As used herein, the term alkyl unless otherwise modified refers to both cyclic and noncyclic groups, although of course cyclic groups will comprise at least three carbon ring members. Aryl groups, such as those of triarylsulfonium PAGs, are preferably carbocyclic aryl e.g. phenyl, naphthyl, etc., rather than heteroaromatic groups.

As discussed above, PAGs of the invention are useful as the radiation sensitive component in photoresist compositions, including both positive-acting and negative-acting chemically amplified resist compositions.

The photoresists of the invention typically comprise a resin binder and a photoactive component of the invention as described above. Preferably the resin binder has functional groups that impart alkaline aqueous developability to the resist composition. For example, preferred are resin binders that comprise polar functional groups such as hydroxyl or carboxylate. Preferably the resin binder is used in a resist composition in an amount sufficient to render the resist developable with an aqueous alkaline solution. For example, preferred resin binders are phenolic resins including phenol aldehyde condensates known in the art as novolak resins, homo and copolymers of alkenyl phenols and homo and copolymers of N-hydroxyphenyl-maleimides.

Examples of suitable phenols for condensation with a aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

Preferably, a photoacid generator compound of the invention is employed in a chemically amplified positive-acting resist. A number of such resist compositions have been described, e.g., in U.S. Pat. Nos. 4,968,581; 4,883,740; 4,810,613 and 4,491,628 and Canadian Patent Application 2,001,384, all of which are incorporated herein by reference for their teaching of making and using chemically amplified positive-acting resists. In accordance with the present invention, those prior resist compositions are modified by substitution of the photoactive component of the invention as the radiation sensitive component.

A particularly preferred chemically amplified photoresist of the invention comprises in admixture a photoactive component of the invention and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

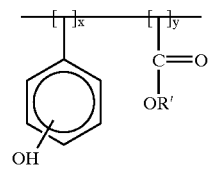

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_W$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbomanyl or vinyl cyclohexanol compound, also may be used as a resin binder in compositions of the invention. Such copolymers also may be prepared by such free radical polymerization or other known procedures and suitably will have a $M_W$ of from about 8,000 to about 50,000, and a molecular weight distribution of about 3 or less.

Another preferred resin binder for a positive chemically amplified resist of the invention has phenolic and nonaromatic cyclic alcohol units, wherein at least of portion of the hydroxyl groups of the copolymer are bonded to acid labile groups. Preferred acid labile moieties are acetate groups including t-butyl acetate groups of the formula $(CH_3)_3COC(O)CH_{-2}$; oxycarbonyl groups such as t-butyl oxycarbonyl (t-Boc) groups of the formula $(CH_3)_3CC(O)O$—; and acetal and ketals. Chemically amplified positive-acting photoresists containing such a copolymer have been disclosed in U.S. Pat. No. 5,258,257 to Sinta et al.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783 136A2 of the Shipley Company (terpolymers and other copolymers including styrene/hydroxystyrene/t-butylacrylate copolymers). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

Preferred negative-acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

Photoresists of the invention also may contain other materials. For example, other optional additives include actinic and contrast dyes, anti-striation agents, plasticizers, speed enhancers, sensitizers (e.g. for use of a PAG of the invention at longer wavelenghs such as G-line), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetrabutylammonium hydroxide (TBAH), which can enhance resolution of a developed resist relief image. The added base is suitably used in relatively small amounts, e.g. about 1 to 10 percent by weight relative to the PAC, more typically 1 to about 5 weight percent. 1. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that a PAG of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; lactates such as ethyl lactate or methyl lactate, with ethyl lactate being preferred; proponiates, particularly methyl propionate and ethyl propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Printed circuit board substrates such as copper clad laminates are also particularly preferred. The photoresists of the invention will be particularly useful for circuit board imaging, including through hole and other aperture plating. Typical printed circuit board substrates have one or more copper layers interleaved with resin layers, such as epoxy layers.

Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. An I-line (365 nm) exposure wavelength often preferably will be used for the photoresists of the invention. Other suitable exposure include sub-300 nm such as 248 nm, or longer wavelengths such as G-line (435 nm). Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting example is illustrative of the invention.

EXAMPLE 1

Photoresist compositions of the invention were prepared containing PAGs of 1) diphenyliodonium 9,10-dimethoxyanthracene-2-sulfonate (referred to below as "PAG 1"); 2) di(t-butylphenyl)iodonium 9,10-dimethoxyanthracene-2-sulfonate (referred to below as "PAG 2"); and 3) tri(t-butylphenyl)iodonium 9,10-dimethoxyanthracene-2-sulfonate (referred to below as "PAG 3").

More specifically, three positive-acting photoresist compositions were prepared, referred to as Resists 1–3 respectively. Each of the photoresists contained a resin mixture of 1) a partially hydrogenated polyvinylphenol polymer that had a portion of hydroxyl units masked with ethoxyethyl groups, 2) a terpolymer of hydroxystyrene, styrene and t-butylacrylate groups. Resist 1 contained a PAG mixture of 1) PAG 1 and 2) di(t-butylphenyl)iodonium camphorsulfonate. Resist 2 contained a PAG mixture of 1) PAG 2 and 2) di(t-butylphenyl)iodonium camphorsulfonate. Resist 3 contained a PAG mixture of 1) PAG 3 and 2) di(t-butylphenyl)iodonium camphorsulfonate. In each of the PAGs blends of Resists 1–3, the anthracene acid PAG was present 4 parts by weight to 1 part by weight of the camphorsulfonate PAG. The resin mixture constituted 93.25 weight percent of total solids (all components except solvent) of each of Resists 1–3; the PAG blend constituted 6.0 weight percent of total solids of each of Resists 1–3. Resists 1–3 were each formulated at 6.3 weight percent solids in a solvent mixture of ethyl lactate and propylene glycol methyl ether.

Each of Resists 1–3 were spin coated onto silicon wafers as well as over silicon wafers with a cross-linked antireflective coating layer. Resist s were applied at a coating layer thickness of approximately 7650 angstroms, and the coated substrates were soft-baked on a vacuum hotplate at 90° C. for approximately 60 seconds. The resist layers were then exposed to patterned radiation of 365 nm (ASM stepper NA=0.6, σ=0.75). The exposed resist layers were then baked at 110° C. for approximately 60 seconds and developed with 0.26N tetramethylammonium hydroxide aqueous solution. 0.3 μm lines and spaces were resolved for Resists 1 and 2, and inferior results were obtained for Resist 3. Accordingly, iodonium-based PAGs of the invention may be preferred over sulfonium-based PAGs.

The foregoing description of the invention is merely illustrative thereof, and it is understood that variations and modifications can be effected without departing from the spirit or scope of the invention as set forth in the following claims.

What is claimed is:

1. A positive-acting photoresist composition comprising:
a resin binder and a photoacid generator compound in an amount sufficient to permit development of an exposed coating layer of the composition,
the resin binder selected from the group consisting of 1) a copolymer of a vinyl phenol and alkyl acrylate; 2) an acetal or ketal resin; 3) a polymer containing styrene and/or hydroxystyrene units; or 4) a polymer containing t-butyl acrylate units,
the photoacid generator generating an alkoxy anthracene sulfonate acid upon exposure to activating radiation, and is a compound of Formulae I, II, III, IV, VI, VIII, IX, XI, XIA, XIB, XII, XIIA or XIIB as those formulae are defined below:

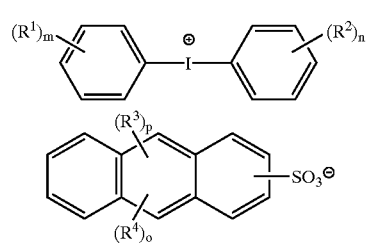

wherein $R^1$ and $R^2$ are each independently selected from the group consisting of halo, hydroxy, nitro, cyano, sulfonyl, optionally substituted alkyl, optionally substituted alkoxy, optionally substituted aminoalkyl, optionally substituted alkylthio, optionally substituted alkylsulfinyl, optionally substituted alkylsulfonyl, optionally substituted aryloxy, optionally substituted aralkyl, optionally substituted alkanoyl, optionally substituted carbocyclic aryl, optionally substituted heteroaromatic or heteroalicyclic;

$R^3$ and $R^4$ are the same or different and are selected from the same group as defined for $R^1$ and $R^2$ above, with at least one of $R^3$ and $R^4$ being optionally substituted alkoxy;

m and n are each independently an integer of from 0 to 5;

o and p are each independently an integer of 0 or greater, wherein the sum of o and p is greater than zero and 8 or less;

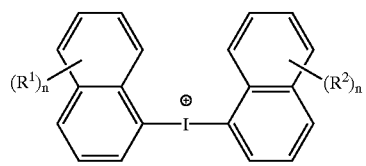

II

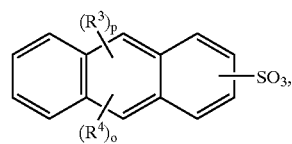

wherein $R^1$, $R^2$, $R^3$, $R^4$, o and p are each as defined above for Formula I; and m and n are each independently an integer from 0 to 7;

III

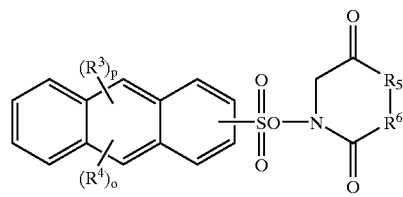

wherein $R^3$, $R^4$, o and p are the same as defined in Formula I above; and $R^5$ and $R^6$ are independently optionally substituted alkyl, optionally substituted alkoxy, or optionally substituted alkylthio;

IV

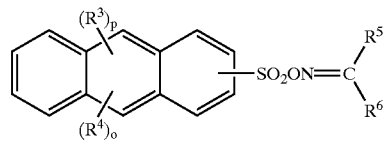

wherein $R^3$, $R^4$, o and p are the same as defined in Formula I above; and $R^5$ and $R^6$ are the same as defined in Formula III above;

VI

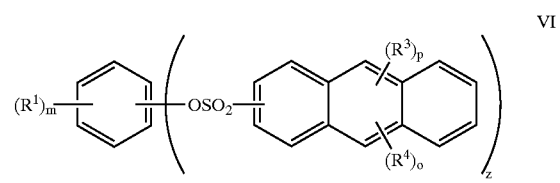

wherein $R^1$, $R^3$, $R^4$, p and o are the same as defined in Formula I above;

m is an integer from 0 to 4; and z is an integer from 1 to 6;

VIII

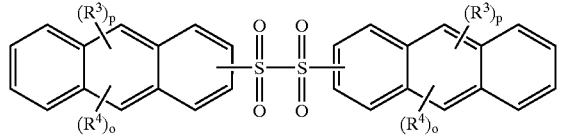

wherein each $R^3$, $R^4$, p and o are the same as defined in Formula I above;

IX

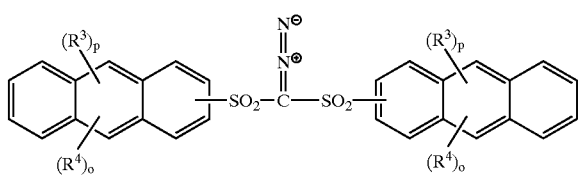

wherein each $R^3$, $R^4$, p and o are the same or different and are the same as defined in Formula I above;

XI

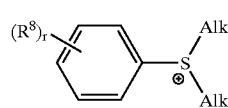

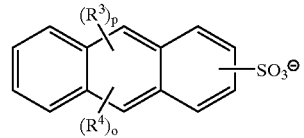

wherein $R^3$, $R^4$, p and o are the same as defined in Formula I above;

$R^8$ is the same as defined for $R^1$ in Formula I above;

r is an integer of from 0 to 5; and each Alk is the same or different optionally substituted alkyl; or each Alk may be taken together and form a $C_{2-8}$ alkylene or alkenylene chain and thereby form a ring with the sulfur cation;

XIA

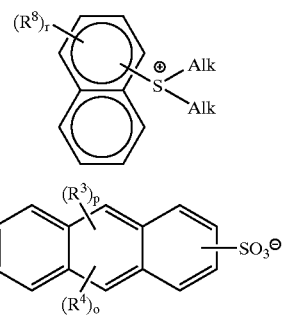

wherein all substituents are as defined in Formula XI above, except that r is an integer from 0 to 7;

XIB

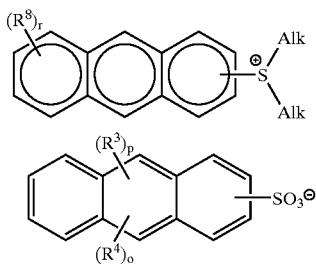

wherein all substituents are as defined in Formula XI above, except that r is an integer from 0 to 9;

XII

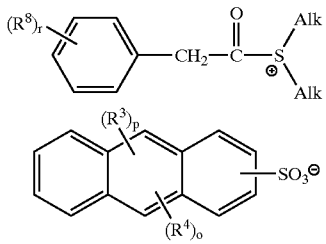

wherein $R^3$, $R^4$, p and o are the same as defined in Formula I above;

$R^8$ and r are the same as defined in Formula XI above;

each Alk is the same or different optionally substituted alkyl; or each Alk may be taken together and form a $C_{2-8}$ alkylene or alkenylene chain and thereby form a ring with the sulfur cation;

XIIA

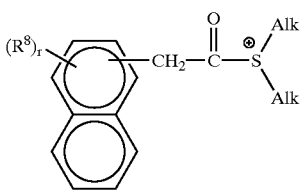

-continued

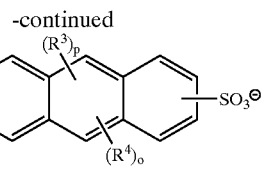

wherein all substituents are as defined in Formula XII above, except that r is an integer from 0 to 7;

XIIB

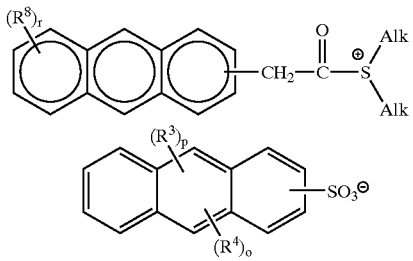

wherein all substituents are as defined in Formula XII above, except that r is an integer from 0 to 9.

2. The positive-acting photoresist composition of claim 1 wherein the anthracene group of Formula II has an additional —$SO_3$ moiety, and the sum of p and o is 8 or less.

3. The positive-acting photoresist composition of claim 1 wherein the anthracene group of Formula XIA has an additional —$SO_3$ moiety, and the sum of p and o is 8 or less.

4. The positive-acting photoresist composition of claim 1 wherein the anthracene group of Formula XIB has an additional —$SO_3$ moiety, and the sum of p and o is 8 or less.

5. The positive-acting photoresist composition of claim 1 wherein the anthracene group of Formula XII has an additional —$SO_3$ moiety, and the sum of p and o is 8 or less.

6. The positive-acting photoresist composition of claim 1 wherein the anthracene group of Formula XIIA has an additional —$SO_3$ moiety, and the sum of p and o is 8 or less.

7. The positive-acting photoresist composition of claim 1 wherein the anthracene group of Formula XIIB has an additional —$SO_3$ moiety, and the sum of p and o is 8 or less.

8. An article of manufacture having on at least one surface a coating layer of the positive-acting photoresist composition of claim 1.

9. An article of manufacture comprising a microelectronic wafer that has on at least one surface a coating layer of a positive-acting photoresist of claim 1.

10. An article of manufacture comprising a printed circuit board substrate that has on at least one surface a positive-acting coating layer of a photoresist of claim 1.

11. The article of claim 10 wherein the printed circuit board substrate is a copper clad laminate.

12. A method for forming a photoresist relief image on a substrate comprising:
(a) applying a coating layer of a negative-acting photoresist composition on a substrate; and
(b) exposing the photoresist coating layer to patterned activating radiation and developing the exposed photoresist layer to provide a relief image; and
wherein the negative-acting photoresist composition comprises:
a resin binder and a photoacid generator compound in an amount sufficient to permit development of an exposed coating layer of the composition, the photoacid generator generating an alkoxy anthracene sulfonate acid upon exposure to activating radiation, and selected from the group consisting of diaryliodonium salts, diphenyliodonium salts, dinaphthyliodonium salts, N-oxyimidosulfonates, phenolic sulfonates, benzylic sulfonates, disulfones, diazosulfones, triarylsulfonium salts, aryl(dialkyl)sulfonium salts, phenacylsulfonium salts, naphthylacylsulfonium salts, and acenaphthylacylsulfonium salts, all of which may be optionally substituted wherein the negative-acting photoresist coating layer is exposed to radiation having a wavelength selected from the group consisting of about 248 nm, 300 nm, 365 nm and about 435 nm.

13. An article of manufacture comprising a microelectronic wafer that has on at least one surface a coating layer of a negative-acting photoresist, wherein the negative-acting photoresist comprises:

a resin binder and a photoacid generator compound in an amount sufficient to permit development of an exposed coating layer of the composition, the photoacid generator generating an alkoxy anthracene sulfonate acid upon exposure to activating radiation, and selected from the group consisting of diaryliodonium salts, diphenyliodonium salts, dinaphthyliodonium salts, N-oxyimidosulfonates, N-oxyiminosulfonate, phenolic sulfonates, benzylic sulfonates, disulfones, diazosulfones, triarylsulfonium salts, aryl(dialkyl)sulfonium salts, phenacylsulfonium salts, naphthylacylsulfonium salts, and acenaphthylacylsulfonium salts, all of which may be optionally substituted.

14. An article of manufacture comprising a printed circuit board substrate that has on at least one surface a coating layer of a negative-acting photoresist, wherein the negative-acting photoresist comprises:

a resin binder and a photoacid generator compound in an amount sufficient to permit development of an exposed coating layer of the composition, the photoacid generator generating an alkoxy anthracene sulfonate acid upon exposure to activating radiation, and selected from the group consisting of diaryliodonium salts, diphenyliodonium salts, dinaphthyliodonium salts, N-oxyimidosulfonates, N-oxyiminosulfonate, phenolic sulfonates, benzylic sulfonates, disulfones, diazosulfones, triarylsulfonium salts, aryl(dialkyl)sulfonium salts, phenacylsulfonium salts, naphthylacylsulfonium salts, and acenaphthylacylsulfonium salts, all of which may be optionally substituted.

15. The article of claim 14 wherein the printed circuit board substrate is a copper clad laminate.

16. A photoacid generator compound that can generate an anthracene sulfonate acid upon exposure to activating radiation, the photoacid generator compound generating an alkoxy anthracene sulfonate acid upon exposure to activating radiation being a compound of Formulae III, VI, VII, IX, XII, XIIA or XIIB as those formulae are defined below:

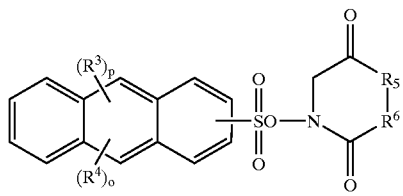

III wherein $R^3$ and $R^4$ are each independently a non-hydrogen substituent selected from the group consisting of halo, hydroxy, nitro, cyano, sulfonyl, optionally substituted alkyl, optionally substituted alkoxy, optionally substituted aminoalkyl, optionally substituted alkylthio, optionally substituted alkylsulfonyl, optionally substituted alkylsulfonyl, optionally substituted aryloxy, optionally substituted aralkyl, optionally substituted alkanoyl, optionally substituted carbocyclic aryl, optionally substituted heteroaromatic or heteroalicyclic, with at least one of $R^3$ and $R^4$ being optionally substituted alkoxy;

o and p are each independently an integer of 0 or greater, wherein the sum of o and p is greater than zero and 8 or less; and $R^5$ and $R^6$ are independently optionally substituted alkyl, optionally substituted alkoxy, or optionally substituted alkylthio;

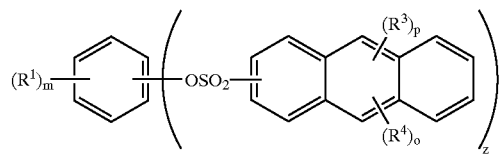

VI wherein $R^3$, $R^4$, p and o are the same as defined in Formula III above;

each R' is independently the same as defined for $R^3$ and $R^4$ in Formula III above;

m is an integer from 0 to 4; and z is an integer from 1 to 6;

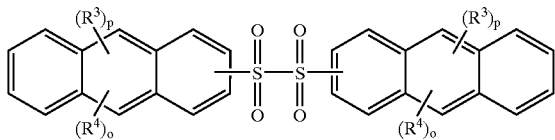

VIII wherein each $R^3$, $R^4$, p and o are the same as defined in Formula III above;

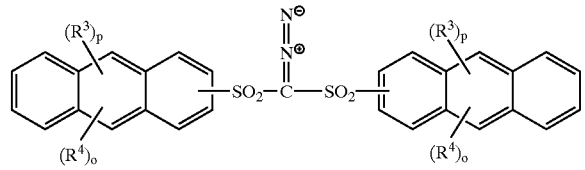

IX wherein each $R^3$, $R^4$, p and o are the same or different and are the same as defined in Formula III above;

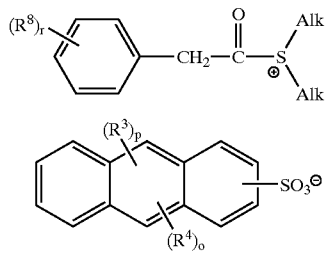

XII

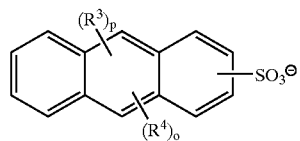

wherein $R^3$, $R^4$, p and o are the same as defined in Formula III above;

$R^8$ is the same as defined for R' in Formula I above;

r is an integer of from 0 to 5;

each Alk is the same or different optionally substituted alkyl; or each Alk may be taken together and form a $C_{2-8}$ alkylene or alkenylene chain and thereby form a ring with the sulfur cation;

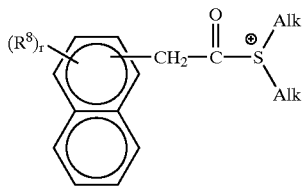

XIIA

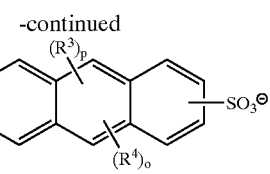

wherein all substituents are as defined in Formula XII above, except that r is an integer from 0 to 7;

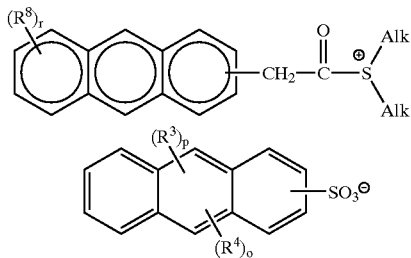

XIIB wherein all substituents are as defined in Formula XII above, except that r is an integer from 0 to 5.

17. The photoacid generator of claim 16 wherein the anthracene group of Formula XII has an additional —$SO_3$ moiety, and the sum of p and o is 8 or less.

18. The photoacid generator of claim 16 wherein the anthracene group of Formula XIIA has an additional —$SO_3$ moiety, and the sum of p and o is 8 or less.

19. The photoacid generator of claim 16 wherein the anthracene group of Formula XIIB has an additional —$SO_3$ moiety, and the sum of p and o is 8 or less.

* * * * *